United States Patent [19]

Cook

[11] Patent Number: 4,519,871
[45] Date of Patent: May 28, 1985

[54] BUBBLE-MODE LIQUID PHASE EPITAXY

[76] Inventor: Melvin S. Cook, P.O. Box 38, Saddle River, N.J. 07458

[21] Appl. No.: 555,276

[22] Filed: Nov. 25, 1983

[51] Int. Cl.$^3$ ............................................. C30B 19/00
[52] U.S. Cl. ..................................................... 156/622
[58] Field of Search ....... 156/622, 624, 621, DIG. 70, 156/DIG. 104; 422/253, 245; 148/171; 427/87

[56] References Cited

U.S. PATENT DOCUMENTS

| | | | |
|---|---|---|---|
| 4,126,930 | 11/1978 | Moon | 156/622 |
| 4,386,975 | 6/1983 | Leibenzeder | 156/622 |
| 4,406,245 | 9/1983 | Heinen | 156/622 |
| 4,418,039 | 11/1983 | Adler | 422/82 |

Primary Examiner—Hiram H. Bernstein
Attorney, Agent, or Firm—Gottlieb, Rackman & Reisman

[57] ABSTRACT

A method and apparatus for growing multiple epitaxial layers with at least two different compositions on a substrate from solutions. The substrate is mounted in a channel communicating with solutions of different compositions. A gas bubble located in the channel separates the solutions from each other. The different solutions are moved into sequential contact with the substrate in order to grow the epitaxial layers in the sequence desired, with a gas bubble sweeping across the substrate between sequential contact with the substrate of the different solutions.

1 Claim, 7 Drawing Figures

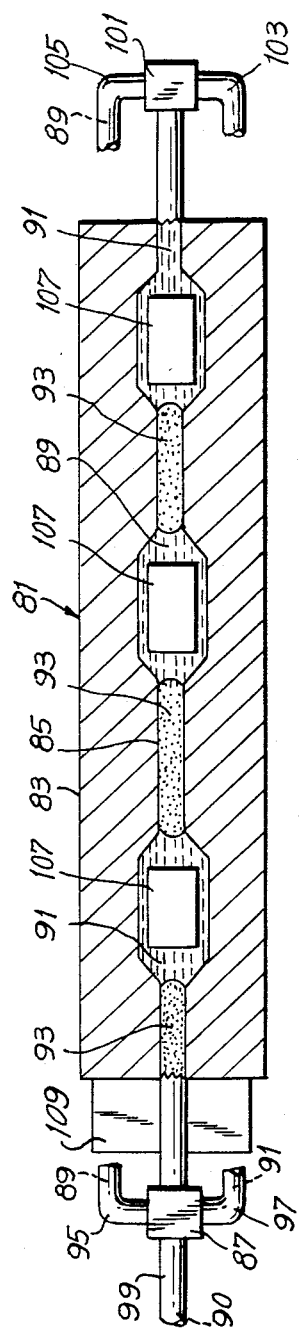
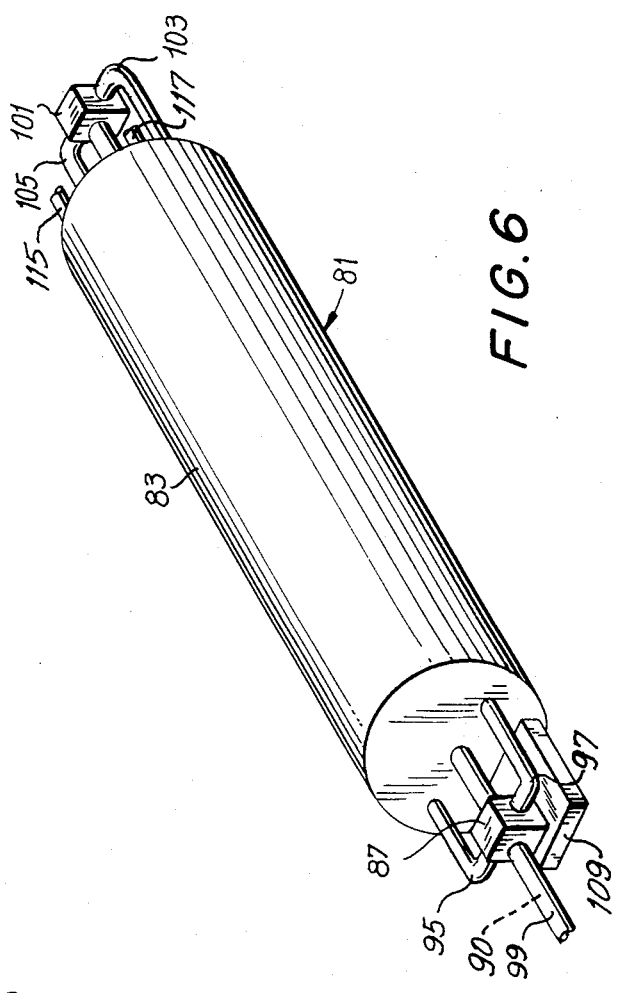
FIG. 5
FIG. 6

BUBBLE-MODE LIQUID PHASE EPITAXY

DESCRIPTION

This invention relates to a method and apparatus for the low-cost production of multiple epitaxial layers on crystalline substrates. It can be used, for example, to produce superlattice semiconductor structures for use in electronic and optoelectronic devices.

Multiple epitaxial layer structures can have properties which are useful in certain applications. However, the use of such structures has been impeded by the high costs and difficulties associated with their production.

It is an object of the present invention to provide a method for the low-cost production of multiple epitaxial layer structures.

It is an additional object of the present invention to provide apparatus for the low-cost production of multiple epitaxial layer structures.

Briefly, in accordance with the principles of my invention and in the preferred embodiment thereof, a substrate is positioned with one surface facing a channel. A first solution is contacted to the substrate in the channel (the "bubble channel") and an epitaxial layer of a first composition is grown to a desired thickness by liquid phase epitaxy. A second solution, separated from the first solution in the bubble channel by a gas bubble, is then brought into contact with the substrate by moving the gas bubble across the substrate and thereby sweeping the first solution away from the substrate. An epitaxial layer of a second composition is then grown on the substrate to a desired thickness by liquid phase epitaxy. If the first and second solutions differ in composition from each other, then the first and second compositions of the epitaxial layers may differ from each other. If the substrate has a single-crystal structure and if the materials involved have a suitable lattice match, then the epitaxial layers may have a single-crystal structure. The process can be continued until the desired number of epitaxial layers have been grown on the substrate. Care must be taken to avoid use of volatile constituents in the solutions which can diffuse through the gas bubble if this will produce undesirable contamination effects.

In view of the key role of the gas bubble in this liquid phase epitaxy growth technique, the technique may be termed "bubble-mode liquid phase epitaxy".

In a particular example, the first solution is a gallium solution of gallium arsenide, and the second solution is a gallium solution of aluminum gallium arsenide. Growth of epitaxial layers on a gallium arsenide substrate can take place in a suitable temperature range, for example, between 750° Centigrade and 800° Centigrade, by cooling the solutions in order to develop a condition of supersaturation. By alternately growing epitaxial layers of gallium arsenide and of aluminum gallium arsenide on the gallium arsenide substrate with suitable thicknesses (e.g., $10^2$–$10^4$ Angstroms), a superlattice structure can be produced on the substrate. The thickness of an epitaxial layer thus grown can be controlled by controlling the time duration of contact of the substrate with the solution, the temperatures of the solution and the substrate, and the compositions of the solution.

Further objects, features, and advantages of my invention will become apparent upon consideration of the following detailed description in conjunction with the drawing, in which:

FIG. 5 is a cross-sectional view of an apparatus for implementing bubble-mode liquid phase epitaxy;

FIG. 6 is a perspective view of the apparatus of FIG. 5; and

Figure 1:
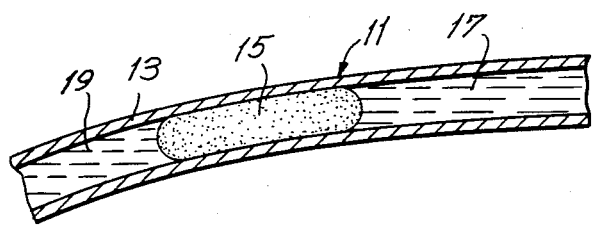
FIG. 1 is a cross-sectional view of a bubble channel containing two solutions separated by a gas bubble.

In FIG. 1, a cross-sectional view of bubble channel 11 is shown. It is comprised of a cylindrical tube 13 containing gas bubble 15 which separates solution 17 from solution 19. If the pressure acting on solution 17 is increased, then solution 17, gas bubble 15, and solution 19 move to the left, and vice versa.

The location of the gas bubble in the bubble channel can be monitored by making a local measurement of a property of the material in the bubble channel as, for example, density, capacitance, dielectric constant, or electrical resistance. While not shown in FIG. 1, any of conventional means may be employed for making such a measurement.

Figure 2:
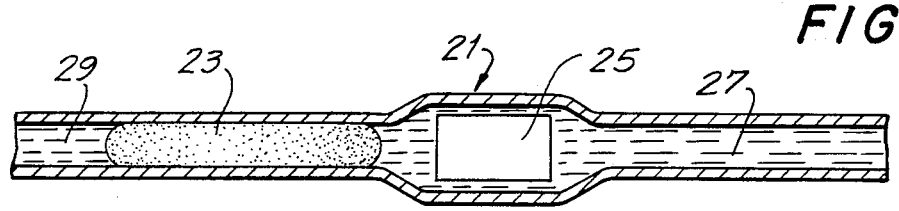
FIG. 2 is a cross-sectional view of a bubble channel containing a substrate and two solutions separated by a gas bubble.

In FIG. 2, a cross-sectional view of bubble channel 21 is shown. As gas bubble 23 moves, it always fills a cross-section of the bubble channel in order to prevent mixing of solution 27 and solution 29. Preferably, the bubble channel has a smoothly-varying cross-section in order to inhibit detachment of the gas bubble from the walls of the bubble channel.

If, at some time, solution 27 covers the substrate 25, then moving the gas bubble 23 across the substrate will sweep solution 27 away and will bring solution 29 into contact with the substrate, and vice versa. By the use of this procedure, it is possible to alternately grow epitaxial layers of a first and of a second composition on the substrate from solution 27 and solution 29, respectively.

Figure 3:
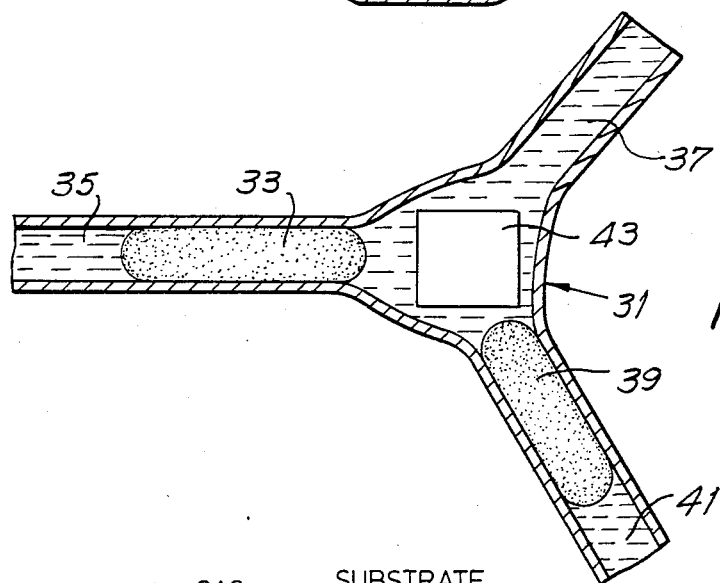
FIG. 3 is a cross-sectional view of a bubble channel containing a substrate and three solutions separated by two gas bubbles.

In FIG. 3, a cross-sectional view of bubble channel 31 is shown. Gas bubble 33 separates solution 35 from solution 37, and gas bubble 39 separates solution 37 from solution 41. When gas bubble 33 or gas bubble 39 moves through the bubble channel, the different solutions will not mix with each other as long as a cross-section of the bubble channel between the different solutions is always filled by a gas bubble. By moving gas bubble 33 or gas bubble 39 across the substrate 43, which of solutions 35, 37, or 41 contacts the substrate can be controlled. Coalescence of two gas bubbles on contact with each other can be prevented by charging the surfaces of the gas bubbles to the same electrical polarity. If the solutions are electrically conductive, this can be accomplished by contacting a source of electrical potential to them.

Figure 4:
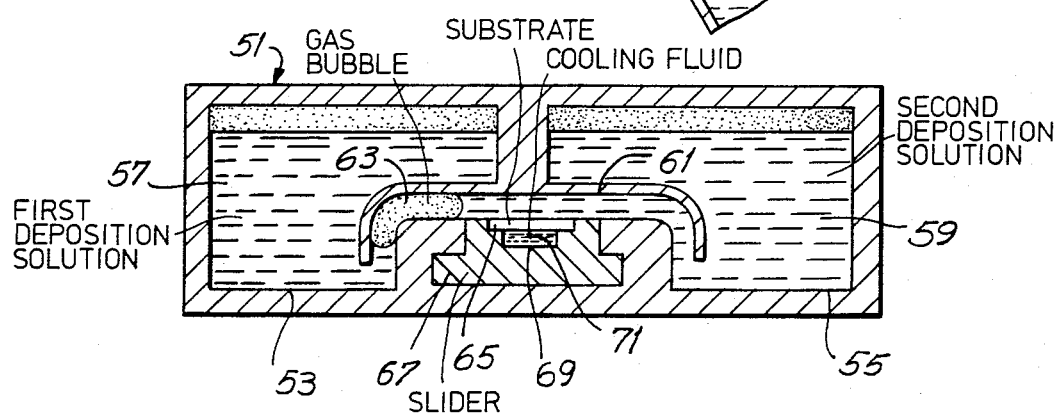
FIG. 4 is a cross-sectional view of a schematic representation of a bubble-mode liquid phase epitaxy apparatus.

In FIG. 4, apparatus 51 is shown in cross-sectional view. Bubble channel 61 communicates at one of its ends with solution 57 in well 53, and at its other end with solution 59 in well 55. Gas bubble 63 separates solution 57 from solution 59 in the bubble channel 61.

The location of the gas bubble determines which of solution 57 or solution 59 is in contact with the substrate. The location of the gas bubble in the bubble channel can be changed by tilting the apparatus 51 in order to change the height of one well with respect to the other well. Determining which solution is in contact with the substrate determines the composition of the epitaxial layer being grown at any time.

The substrate 65 is mounted in slider 67. The slider moves in a direction perpendicular to the plane of FIG. 4 in order to move the substrate into or out of the bubble channel. Conduit 69 in the slider carries cooling fluid 71 to the substrate. While the nature of an acceptable cooling fluid depends upon the compositions and temperatures of the materials it will encounter, hydrogen gas is often an acceptable cooling fluid. The cooling fluid helps to induce a condition of supersaturation in the solution contacting the substrate and to control the temperatures of the substrate and the solutions. If a source of heat is required, the apparatus can be located in an oven. While an oven is not shown in FIG. 4, any of conventional ovens can be used for this purpose.

While the apparatus shown in FIG. 4 and described in connection therewith has provision for the use of only two different solutions, it is clear from FIG. 3 and the description thereof that more than two different solutions can be employed, and epitaxial layers of more than two different compositions can be grown on a substrate using the present invention.

In FIG. 5, apparatus 81 is shown schematically in cross-sectional view. The apparatus has a cylindrical exterior 83, which allows it to be placed in a tube of a tube furnace, which can act as a source of heat. A tube furnace is not shown, but any of conventional tube furnaces can be used for this purpose.

Bubble channel 85 can be connected through input valve 87 to any one of tubes 95, 97, or 99, depending upon its position, from which solution 89 or 91, or gas 90 to form one of gas bubbles 93, respectively, can enter the bubble channel when the input valve 87 is in its appropriate position. The quantities of solution 89 or 91, or of gas 90, which enter the bubble channel is determined by the duration of time that the input valve is in its appropriate position as well as the differential pressures involved.

Output valve 101 divides effluent leaving the bubble channel into a slug of solution 89 or 91 with some gas 90 entrained by dividing the effluent through a gas bubble 93. The output valve 101 can connect the bubble channel to either tube 103 or tube 105. Tube 105 carries solution 89 plus some entrained gas 90 to well 129 (shown in FIG. 7), and tube 103 carries solution 91 to well 127 (shown in FIG. 7). Entrained gas is separated in wells 127 and 129, and the solutions made available for reuse in the bubble channel.

Substrates 107 can be placed in contact with solution 89 or 91 in the bubble channel 85 in order to grow epitaxial layers of a first or second composition, respectively. If it is desired to grow epitaxial layers of more than two different compositions, then provision could be made for use of more than two different solutions.

In FIG. 6, a view in perspective is shown of apparatus 81 shown in FIG. 5. The substrates 107 shown in FIG. 5 are mounted in slider 109, which carries the substrates into or out of the bubble channel. After the desired epitaxial layers have been grown on the substrates, input valve 87 moves to the position in which it connects tube 99 to the bubble channel so that gas 90 can enter the bubble channel and sweep the solutions out. The slider 109 is then removed from the apparatus 81 and the substrates removed. New substrates can then be installed in the slider 109, and the slider reinserted into the apparatus 81. Growth of epitaxial layers can then commence on the new substrates.

Figure 7:
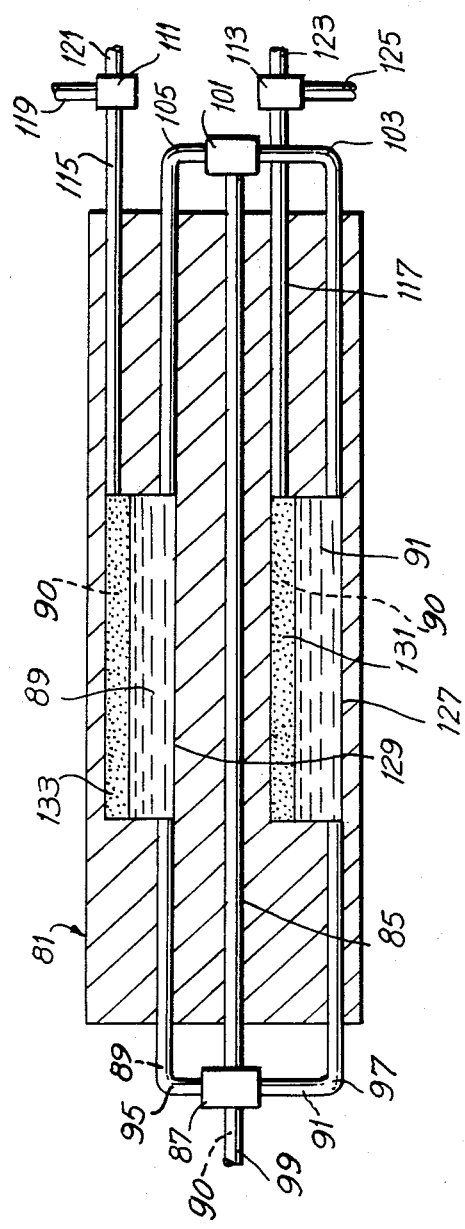
FIG. 7 is a schematic representation of the flow paths of the solutions and gas of the apparatus of FIG. 5 and FIG. 6.

In FIG. 7, a schematic representation is shown of the flow paths of solutions 89 and 91, and of gas 90, in apparatus 81 of FIGS. 5 and 6.

Input valve 87 has a first position in which it connects the bubble channel to tube 95 and is closed to tubes 97 and 99, a second position in which it connects the bubble channel to tube 99 and is closed to tubes 95 and 97, ad a third position in which it connects the bubble channel to tube 97 and is closed to tube 95 and tube 99.

Output valve 101 has a first position in which it connects the bubble channel to tube 103 and is closed to tube 105, a second position in which it connects the bubble channel to tube 105 and is closed to tube 103, and a third position in which it is closed to tubes 103 and 105.

Valve 111 has a first position in which it is closed to tube 119 and connects tube 115 to tube 121, a second position in which it is closed to tubes 119 and 121, and a third position in which it is closed to tube 121 and connects tube 115 to tube 119.

Valve 113 has a first position in which it is closed to tube 125 and connects tube 117 to tube 123, a second position in which it is closed to tubes 123 and 125, and a third position in which it is closed to tube 123 and connects tube 117 to tube 125.

A gas tank connected to tubes 119 and 125 provides gas 90 to establish a gas pressure in space 133 of well 129 and space 131 of well 127, respectively, when valve 111 and valve 113 are in their third positions, respectively. The gas tank is also connected to tube 99 in order to provide gas 90 to the bubble channel when input valve 87 is in its second position. The gas tank is not shown, but any of conventional gas tanks may be used for this purpose. A gas pump is connected to tubes 121 and 123 in order to exhaust some gas 90 from spaces 133 and 131, respectively, when valves 111 and 113 are in their first positions, respectively. The gas pump is not shown, but any of conventional gas pumps may be used for this purpose.

A possible operation cycle could commence with a quantity (slug) of solution 89 entering the bubble channel and a slug of solution 91 leaving the bubble channel. Input valve 87 and output valve 101 would be in their first positions, and valves 111 and 113 in their third and second positions, respectively. After the slug of solution 89 has entered the bubble channel, input valve 87 would move to its second position in order to admit gas 90 to the bubble channel. Output valve 101 would move to its third position, valve 111 would move to its first position, and valve 113 would move to its third position. The next step involves a slug of solution 91 entering the bubble channel and a slug of solution 89 leaving the bubble channel. For this to occur, input valve 87 moves to its third position, output valve 101 moves to its second position, valve 111 moves to its second position, and valve 113 moves to its first position after the slug of solution 91 has entered the bubble channel, whereupon input valve 87 then moves to its second position. Valve 111 remains in its second position until the slug of solution 89 has fully left the bubble channel, and then moves to its third position. When sufficient gas 90 has been exhausted from space 131, valve 113 moves to its second position. This cycle of operation can be repeated until the desired number of epitaxial layers have been grown on the substrates.

If loss of some volatile constitutent from one of the solutions used would adversely affect the stoichiometry of the epitaxial layers, provision must be made for its replenishment, e.g., from the gas supplied from the gas tank.

Although the invention has been described with reference to particular embodiments, it is to be understood that these embodiments are merely illustrative of the application of the principles of the invention. Numerous modifications may be made therein and other arrangements may be devised without departing from the spirit and scope of the invention.

I claim:

1. A method of growing epitaxial layers on a substrate located in a channel from solutions, said epitaxial layers including at least two epitaxial layers that differ in composition from each other, said solutions including at least two solutions that differ in composition from each other, comprising the steps of separating said at least two solutions by at least one gas bubble, growing said at least two epitaxial layers on said substrate in sequence by controlling sequential contact with said substrate of said at least two solutions, and moving a gas bubble across said substrate between said sequential contact with said substrate of said at least two solutions.

* * * * *